United States Patent [19]

Sekiya et al.

[11] 4,072,907
[45] Feb. 7, 1978

[54] AMPLIFIER CIRCUIT

[75] Inventors: Mamoru Sekiya; Nobuyuki Sakabe, both of Nagoya, Japan

[73] Assignee: Shin-Shirasuna Electric Corporation, Nagoya, Japan

[21] Appl. No.: 740,979

[22] Filed: Nov. 11, 1976

[30] Foreign Application Priority Data

Nov. 14, 1975 Japan .............................. 50-136906
Nov. 14, 1975 Japan .............................. 50-136907

[51] Int. Cl.² ............................................ H03F 3/45
[52] U.S. Cl. .................................. 330/261; 330/252; 330/263
[58] Field of Search .......................... 330/13, 17, 30 D

[56] References Cited

U.S. PATENT DOCUMENTS 3,843,935  10/1974  Seki ................................. 330/30 D Primary Examiner—Lawrence J. Dahl

[57] ABSTRACT

An amplifier circuit comprising a differential circuit including means for preventing base bias voltages applied to driver transistors connected with the transistors constituting the differential amplifier from becoming unbalanced. Means is also provided which is adapted to prevent so-called shock noise from appearing at the output of the amplifier circuit. Such means may be constructed by using a delay circuit.

2 Claims, 1 Drawing Figure

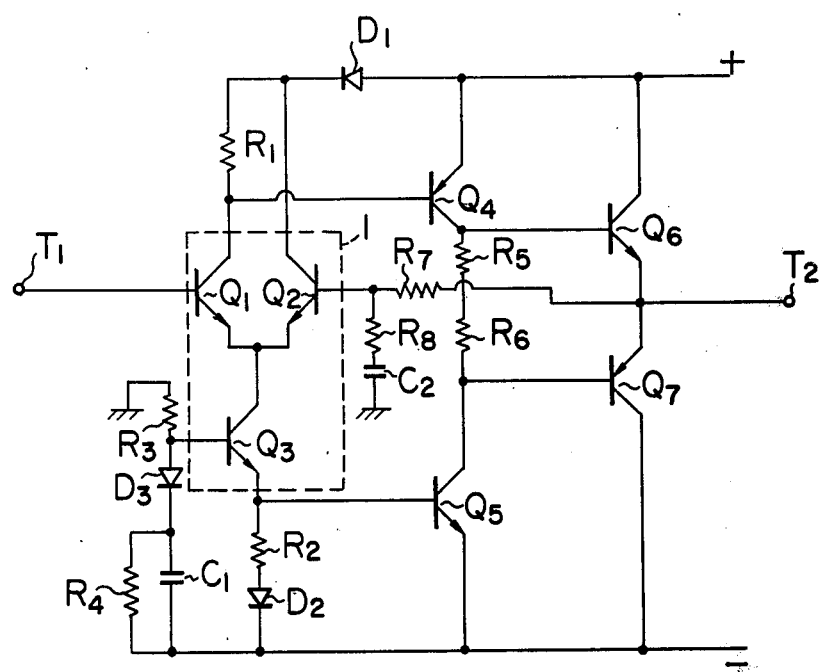

AMPLIFIER CIRCUIT

BACKGROUND OF THE INVENTION

1. Field of the Invention

This invention relates to an amplifier circuit including a differential amplifier circuit.

2. Description of the Prior Art

There have heretofore been proposed a variety of amplifier circuits each including a differential amplifier circuit. With such conventional amplifier circuits, however, there is disadvantage that noise tends to occur due to the fact that base bias voltages applied to post-stage amplifier driving transistors connected with the transistors constituting the differential amplifier circuit become unbalanced when a power source is operatively connected to the amplifier circuit.

As is well known in the art, in such a type of amplifier circuit, so-called shock noise is generated when a power source is turned on so that the amplifier circuit is operatively connected to the power source; in order to prevent such a noise from appearing as an output, it has conventionally been proposed to make the amplifier output open during the duration time of the noise by means of a relay or the like which is provided on the output side of the amplifier. However, such means per se is expensive, and yet an additional circuit or circuits are required for operating such means, which results in the amplifier circuit being more expensive and complicated.

SUMMARY OF THE INVENTION

Accordingly, it is an object of this invention to provide a novel and improved amplifier circuit which is so designed that the aforementioned unbalance of base bias voltages can be eliminated.

It is another object of this invention to provide an amplifier circuit which is so designed as to prevent so-called shock noise from appearing at the output side of the amplifier circuit.

Other objects, features and advantages of this invention will become apparent from the following description taken in conjunction with the accompanying drawing.

BRIEF DESCRIPTION OF THE DRAWING

The drawing is a view showing the amplifier circuit arrangement according to an embodiment of this invention.

DESCRIPTION OF THE PREFERRED EMBODIMENT

Referring to the drawing, there is shown the amplifier circuit according to an embodiment of this invention, wherein $T_1$ and $T_2$ indicate the input and output terminals of the amplifier circuit respectively, and reference symbols + and − represent the positive and negative terminals of a power source (not shown) respectively. There is provided a differential amplifier circuit 1 which comprises a first transistor $Q_1$, second transistor $Q_2$ and third transistor $Q_3$. The first and second transistors $Q_1$ and $Q_2$ have their emitters connected with each other, and the third transistor $Q_3$ has its collector coupled to the connection point between the emitters of the first and second transistors $Q_1$ and $Q_2$. A fourth transistor $Q_4$ has its base connected with the collector of the first transistor $Q_1$, and a fifth transistor $Q_5$ has its base connected with the emitter of the third transistor $Q_3$. These transistors $Q_4$ and $Q_5$ are adapted to serve as a driver for a power amplifier which may be constituted by a sixth transistor $Q_6$ and seventh transistor $Q_7$. As mentioned hereinbefore, with the conventional circuit arrangement, the base bias voltages imparted to such driver transistors tend to be unbalanced when the power source is operatively connected to the circuit arrangement, thus causing noise to be generated. The emitter of the fourth transistor $Q_4$ is connected with the positive terminal of the power source, while the emitter of the fifth transistor $Q_5$ is connected with the negative terminal of the power source. The collectors of these fourth and fifth transistors $Q_4$ and $Q_5$ are connected with each other through resistors $R_5$ and $R_6$. Furthermore, the collector of the fourth transistor $Q_4$ is connected with the base of the transistor $Q_6$, while the collector of the fifth transistor $Q_5$ is connected with the base of the seventh transistor $Q_7$. The sixth and seventh transistors $Q_6$ and $Q_7$ have their emitters connected with each other and their collectors with the positive and negative terminals of the power source respectively. The input terminal $T_1$ is connected with the base of the first transistor $Q_1$. The base of the second transistor $Q_2$ is grounded through a series circuit of a resistor $R_8$ and capacitor $C_2$ and also coupled to the connection point between the emitters of the sixth and seventh transistors $Q_6$ and $Q_7$ through a resistor $R_7$. The output terminal $T_2$ is led out of the connection point between the emitters of the transistors $Q_6$ and $Q_7$.

The collector of the second transistor $Q_2$ is connected with the positive terminal of the power source through a diode $D_1$ which is forwardly connected, and the collector of the first transistor $Q_1$ is connected with the aforementioned positive terminal through the diode $D_1$ and a resistor $R_1$. The emitter of the third transistor $Q_3$ is connected with the negative terminal of the power source through a series circuit of a resistor $R_2$ and diode $D_2$ which is forwardly connected. The base of the transistor $Q_3$ is grounded through a resistor $R_3$ and also connected with the negative terminal of the power source through a parallel circuit of a capacitor $C_1$, resistor $R_4$ and diode $D_3$ which is forwardly connected.

In operation, a signal arriving at the input terminal $T_1$ will be amplified in the differential amplifier circuit 1, and then the amplified signal will be fed from the collector of the first transistor $Q_1$ to the base of the fourth transistor $Q_4$. In this case, the fifth transistor $Q_5$ acts as a load resistor with respect to the fourth transistor $Q_4$, the output of which will be imparted to the bases of the transistors $Q_6$ and $Q_7$ so that these transistors will be made to perform push-pull operation. Thus, the signal derived from the transistor $Q_4$ will be power-amplified so as to be taken out of the output terminal $T_2$.

In the foregoing operation, the current from the power source will be caused to flow in substantially the same proportion between the collectors and the emitters of the first and second transistors $Q_1$ and $Q_2$ through the diode $D_1$. In this case, the sum of the currents flowing through the first and second transistors $Q_1$ and $Q_2$ respectively is determined by the third transistor $Q_3$. With the aforementioned circuit arrangement, the transistor $Q_4$ and $Q_5$ are different in respect of conductivity type from each other but are identical in respect of characteristics, the transistor $Q_5$ being adapted to serve as a constant current source for flowing a constant current through each of the resistors $R_5$ and $R_6$. DC bias voltage for the fourth transistor $Q_4$ is provided by the diode $D_1$ and resistor $R_1$. Assume that the current flowing through the transistor $Q_1$ is $i_1$ and that the current flowing through the transistor $Q_2$ is $i_2$. Then, a voltage $v_1$ equal to the product $(i_1 + i_2) \times$ (the internal resistance of the diode $D_1$) will be obtained across the diode $D_1$, and a voltage $v_2$ equal to the product $R_1 \times i_1$ will be available across the resistor $R_1$; thus, the base bias voltage of the fourth transistor $Q_4$ will be equal to $v_1 + v_2$. The transistor $Q_5$ will now be considered. A current $(i_1 + i_2)$ will flow through the series circuit of the resistor $R_2$ and diode $D_2$. Assume that the diodes $D_1$ and $D_2$ are identical ones. Then, the voltages across these diodes will be equal to each other. Thus, the voltage across the resistor $R_2$ will be $(i_1 + i_2) \times R_2$ so that it is possible to make the voltages across the resistor $R_2$ equal to that across the resistor $R_1$ by selecting the value for the resistor $R_2$ so as to make such a value equal to one half of the value for the resistor $R_1$. In this way, the base voltages of the fourth and fifth transistors $Q_4$ and $Q_5$ can always be maintained to be equal to each other so that occurrence of such an unbalance as mentioned in the preamble portion of this specification can be effectively prevented.

When power source switch is turned on so that the power source is operatively connected with the amplifier circuit, current will flow from the earth through the resistor $R_3$ and then throgh the diode $D_3$ - capacitor $C_1$ and through the diode $D_3$ - resistor $R_4$. The base-emitter voltage of the third transistor $Q_3$ is nil before the power source is operatively connected with the amplifier circuit; when the power source switch is turned on, such base-emitter voltage will appear after a predetermined period of time and build up following the $I_C$-$V_{BE}$ curve of the transistor $Q_3$, the cut-off point of which corresponds, in this case, to the point where the base-emitter voltage appears. In such a case, shock noise will be generated when the power source switch is turned on, such noise having a duration time which is considerably longer than the period of time from the time when the power source is connected to the amplifier to the time when said cut-off point is reached. To this end, according to this embodiment, there is provided a delay circuit constituted by the capacitor $C_1$, resistor $R_4$, resistor $R_3$ and diode $D_3$, such a delay circuit being connected with the base of the third transistor $Q_3$, and the values and characteristics of the elements constituting the delay circuit are so selected that the delay time of the delay circuit becomes equal to or longer than the duration time of noise as mentioned above.

As will be appreciated from what has been described above, in accordance with this invention, it is possible to effectively solve, with the simplified circuit arrangement, the aforementioned problem of unbalance which has inevitably been encountered with an amplifier circuit including a differential amplifier. Moreover, it is possible to prevent shock noise generated upon closure of power source switch from appearing as output simply by providing simplified and inexpensive means such as a delay circuit which may be formed by a time constant circuit, without using any expensive means such as relay or the like and associated additional circuit as was the case with the prior art.

We claim:

1. An amplifier circuit including a differential amplifier circuit comprising a first transistor, a second transistor and a third transistor, the emitters of said first and second transistors being connected to each other, the collector of said third transistor being coupled to the connection between the emitters of said first and second transistors; a fourth transistor having the base thereof connected with the collector of said first transistor and having the emitter thereof coupled to one terminal of a power source; a fifth transistor having the base thereof connected with the emitter of said third transistor and having the emitter thereof coupled to the other terminal of said power source; voltage drop producing means; the collectors of said fourth and fifth transistors being connected with each other via said voltage-drop producing means; and a single-ended push-pull amplifier circuit comprising at least two transistors one of which has the base thereof connected with the collector of said fourth transistor and the other one of which has the base thereof connected with the collector of said fifth transistor; a first resistor connected between the collector of said first transistor and said one terminal of said power source, and a second resistor connected between the emitter of said third transistor and said other terminal of said power source, the values of said first and second resistors being selected so that the voltage across said first resistor and the voltage across said second resistor are equal to each other.

2. An amplifier circuit according to claim 1, further comprising a delay circuit connected with the base of said third transistor, the delay time of said delay circuit being so established as to be substantially equal to or slightly longer than the duration time of noise which tends to occur and enter the input of said differential amplifier circuit when said power source is operatively connected with said amplifier circuit, whereby said third transistor is kept in a non-conductive state for a period of time corresponding to said delay time after the operative connection of said power source with said amplifier circuit.

* * * * *